US007949932B2

(12) United States Patent
Yang

(10) Patent No.: US 7,949,932 B2
(45) Date of Patent: May 24, 2011

(54) STRENGTHENING PARITY CHECK BIT PROTECTION FOR ARRAY-LIKE LDPC CODES

(75) Inventor: Sizhen Yang, Irvine, CA (US)

(73) Assignee: Quantum Corporation, San Jose, CA (US)

( * ) Notice: Subject to any disclaimer, the term of this patent is extended or adjusted under 35 U.S.C. 154(b) by 1028 days.

(21) Appl. No.: 11/726,310

(22) Filed: Mar. 20, 2007

(65) Prior Publication Data

US 2008/0235559 A1    Sep. 25, 2008

(51) Int. Cl.
*H03M 13/00* (2006.01)

(52) U.S. Cl. .................. 714/800; 714/752; 714/758

(58) Field of Classification Search .......... 714/752, 714/758, 800

See application file for complete search history.

(56) References Cited

U.S. PATENT DOCUMENTS

| 6,895,547 | B2 * | 5/2005 | Eleftheriou et al. | .......... | 714/801 |
| 7,395,494 | B2 * | 7/2008 | Lee et al. | .................. | 714/801 |
| 2004/0034828 | A1 * | 2/2004 | Hocevar | .................. | 714/800 |
| 2004/0148560 | A1 * | 7/2004 | Hocevar | .................. | 714/801 |
| 2009/0249159 | A1 * | 10/2009 | Lee et al. | .................. | 714/752 |

OTHER PUBLICATIONS

Kim. J.L. et al. (2003). "Explicit Construction of Families of LDPC Codes With No 4-Cycles," IEEE Trans. On Inf. Th., 40: 2378-2388.
Tian, T. et al. (2004). "Selective Avoidance of Cycles in Irregular LDPC Code Construction," IEEE Transaction on Communication, 52(8):1242-1247.

* cited by examiner

*Primary Examiner* — Sam Rizk

(57) ABSTRACT

An LDPC parity check matrix originated using an array code provides more protection against errors for parity bits 1 through 1−p, which can, during decoding, allow faster convergence to a higher LLR value for those bits as well as higher overall reliability of other parity check bits. The present parity check matrix provides an upper triangular sub-matrix ($H_1$) for the parity check bits, where column weights for parity bits 1 through p−1 can be greater than 1. Aspects include encoders to encode user bits using the parity check matrix, decoders to decode based on the parity check matrix, systems comprising encoders and/or decoders, encoder and decoder methods; as well as computer readable media comprising programs for implementing such methods.

17 Claims, 4 Drawing Sheets

STRENGTHENING PARITY CHECK BIT PROTECTION FOR ARRAY-LIKE LDPC CODES

BACKGROUND

1. Field

The following pertains to the fields of information storage and transfer, and more particularly to the field of Low Density Parity Check (LDPC) codes used to encode information for conveyance over a channel, such as an InterSymbol Interference (ISI) channel.

2. Description of Related Art

A "channel" is a term for a model of any system that conveys information through space and/or time, e.g., storage media and communication systems can be modeled as channels.

An InterSymbol Interference (ISI) channel refers to a type of distortion channel. Distortion refers to spreading and consequent overlap of individual elements of a signal to the degree that a receiver cannot reliably distinguish between individual signal elements. For example, a partial response magnetic recording channel is an ISI channel. The wireless fading channel, usually modeled as a tapped-delay-line is also an ISI channel.

Every channel has a capacity. As long as a data transmission rate is less than the channel capacity, it is possible to obtain a low-error rate system through the use of certain error correction codes. Low Density Parity Check (LDPC) Codes codes are known examples of good performance error correction codes that allow transmission rates close to channel capacity at realistic signal-to-noise ratios (SNR).

An LDPC code is a linear block code that can be defined by a parity check matrix with a small number of nonzero elements in each row and column. LDPC codes can be constructed over any Galois Field. For example, a binary LDPC code is defined over GF(2), in which "1" is the only nonzero element. LDPC codes can provide error protection for both data bits and for parity bits. For example, in one type of usage, a parity check matrix, H, defines an LDPC code, and can be for encoding the segments of information bits to produce codewords for storage/transmission on a channel. These codewords can be used to reconstruct the information bits in the presence of ISI.

Different types of LDPC codes exist, as do different ways of constructing such codes. One basic distinction among LDPC codes is whether the code's parity check matrix is constructed randomly or by a repeatable methodology. Taking into account further processing for considerations such as removal of 4-cycles from the parity check matrix, codes constructed randomly can perform as well or better than codes constructed by a repeatable methodology.

One way to generate a LDPC code is by using array codes. In some circumstances, array codes, when used as binary error correcting codes, have sparse parity check matrices that can be used as LDPC codes.

U.S. Pat. No. 6,895,547 (the '547 patent) discloses an array-code like parity check matrix $H=[U|H_2]$ at (9:20-25). H can be used to generate an LDPC codeword having kp bits from (k−j)p information bits, where the remainder of the bits, jp bits, are parity bits. U is a square upper triangular matrix of dimension jp×jp, while $H_2$ is a sparse matrix of size jp×(k−j)p. P is a prime number that is equal to or greater than both j and k. The U portion of H produces the jp parity bits for the codeword. Each of the first p columns of U have column weights of 1, i.e., there is only 1 non-zero element in each column.

In some applications, the jp parity check bits are used in reproducing the (k−j)p information bits at a decoder, but are not, of themselves, retained. In such applications, the parity check bits are discarded after the information bits have been reproduced with sufficient accuracy. In other applications, the accuracy of the parity bits themselves can be important. Also, undetected errors in parity check bits can interfere with accurate determination of the information bits. Therefore, improvements to increase such reliability of the parity bits can be desirable.

SUMMARY

According to one aspect, an apparatus for LPDC encoding of data comprises a processing element configured to produce an LDPC codeword of kp bits from (k−j)p information bits based on a parity check matrix $H=[H_1|H_2]$, having dimension jk×kp. Here, p is a prime number that is equal to or greater than both of numbers k and j, $H_2$ is a sparse matrix of dimension jp×(k−j)p for the (k−j)p information bits, and $H_1$ is an upper triangular sparse matrix of dimension jp×jp for jp parity check bits. One or more of the second column through the $p-1^{th}$ column of H have a column weight of two.

In other aspects, an LDPC decoder comprises an input port for data representative of an LDPC codeword of kp bits; and a processor operable to produce, (k−j)p information bits and jp parity check bits based on a parity check matrix $H=[H_1|H_2]$ of dimension jk×kp. Here, p is a prime number that is equal to or greater than both k and j and $H_1$ is an upper triangular matrix of dimension jp×jp corresponding to parity check bits, and one or more of columns 1 through column p of $H_1$ have a column weight of two.

In still other aspects, a method for LDPC encoding information comprises producing a parity check matrix $H=[H_1|H_2]$ of dimension jk×kp from an array-like code. Here, p is a prime number that is equal to or greater than both j and k, $H_1$ is an upper triangular matrix of dimension jp×jp corresponding to the parity check bits. Column weights of one or more of columns 1 through p are two.

In still other aspects, a computer readable medium having stored thereon programming for a method that comprises producing a parity check matrix $H=[H_1|H_2]$ of dimension jk×kp from an array-like code. Here, p is a prime number that is equal to or greater than both j and k, $H_1$ is an upper triangular matrix of dimension jp×jp corresponding to the parity check bits. Also, column weights of one or more of columns 1 through p are two.

Other objects, features, and advantages of the present invention will become apparent upon consideration of the following detailed description and the accompanying drawings, in which like reference designations represent like features throughout the figures.

BRIEF DESCRIPTION OF THE DRAWINGS

For a fuller understanding of aspects and examples disclosed herein, reference is made to the accompanying drawings in the following description.

DETAILED DESCRIPTION

Figure 1:
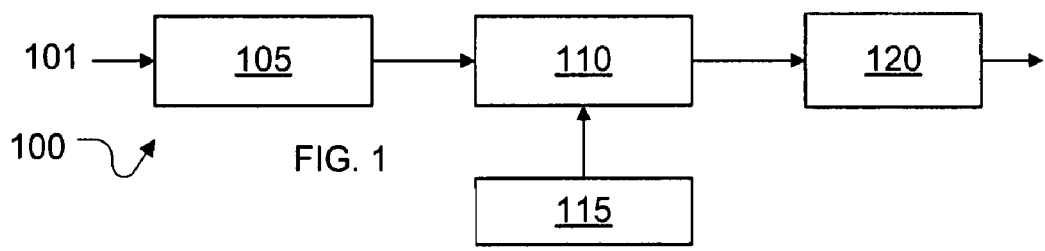
FIG. 1 illustrates an LDPC encoder configured to operate according to aspects described herein.

The following description is presented to enable a person of ordinary skill in the art to make and use various aspects of the inventions. Descriptions of specific techniques, and applications are provided only as examples. Various modifications to the examples described herein will be readily apparent to those skilled in the art, and the general principles defined herein may be applied to other examples and applications without departing from the spirit and scope of the inventions. The exemplary system configurations, components, exemplary tolerances, design criteria, and the like provided herein are for illustrating various aspects and are not intended to limit the configurations, components, and/or criteria that may be accounted for in particular embodiments.

As described above, LDPC codes are linear block error correction codes. LDPC codes also have the characteristic that each code has a parity check matrix with a small number of non-zero elements in each row and column of the matrix. LDPC codes can further be characterized by weights of columns of the matrix. A weight for a column is defined as a number of non-zero elements in that column of the matrix.

Array Code Like LDPC Codes

A challenge of using LDPC codes has been to find methods that can deterministically provide good error correcting performance while also not causing excessive computational complexity.

The '547 patent indicates that the $H_u^s$ matrix found at (9:35-41) can be constructed from an H matrix of dimension jp×kp (1) that has a series of identity matrices I (2) of size p×p in both the first rows and the first columns of H (i.e., the 0 row through the p−1 row and the 0 column through the p−1 column of H are defined by these I matrices.) The remainder of the rows and columns of H are defined by using powers of a p×p sized permutation matrix α (3).

$$H = \begin{bmatrix} I & I & I & \dots & I \\ I & \alpha & \alpha^2 & \dots & \alpha^{k-1} \\ I & \alpha^2 & \alpha^4 & \dots & \alpha^{2(k-1)} \\ \vdots & \vdots & \vdots & \ddots & \vdots \\ I & \alpha^{j-1} & \alpha^{2(j-1)} & \dots & \alpha^{(j-1)(k-1)} \end{bmatrix}_{jp \times kp} \quad (1)$$

$$I = \begin{bmatrix} 1 & 0 & 0 & \dots & 0 \\ 0 & 1 & 0 & \dots & 0 \\ 0 & 0 & 1 & \dots & 0 \\ \vdots & \vdots & \vdots & \ddots & \vdots \\ 0 & 0 & 0 & \dots & 1 \end{bmatrix}_{p \times p} \quad (2)$$

$$\alpha = \begin{bmatrix} 0 & 1 & 0 & \dots & 0 \\ 0 & 0 & 1 & \dots & 0 \\ 0 & 0 & 0 & \dots & \vdots \\ \vdots & \vdots & \vdots & \ddots & 1 \\ 1 & 0 & 0 & \dots & 0 \end{bmatrix}_{p \times p} \quad (3)$$

After the H matrix is obtained, a matrix $H^s$ (4) is obtained by cyclically shifting the rows of H until the jp×jp leftmost subblock of $H^s$ includes the I matrix on its diagonal. Thereafter, this jp×jp leftmost subblock is triangularized by replacing with zeros all non-zero elements found below the diagonal.

$$H^s = \begin{bmatrix} I & I & I & \dots & I & I & \dots & I \\ \alpha^{k-1} & I & \alpha & \dots & \alpha^{j-2} & \alpha^{j-1} & \dots & \alpha^{k-2} \\ \alpha^{2(k-2)} & \alpha^{2(k-1)} & I & \dots & \alpha^{2(j-3)} & \alpha^{2(j-2)} & \ddots & \alpha^{2(k-3)} \\ \vdots & \vdots & \vdots & \ddots & \vdots & \vdots & \ddots & \vdots \\ \alpha^{(j-1)(k-j+1)} & \alpha^{(j-1)(k-j+1)} & \dots & \dots & I & \alpha^{j-1} & \dots & \alpha^{(j-1)(k-1)} \end{bmatrix} \quad (4)$$

The resulting triangularized $H^s$ matrix can be represented by $H_u^s$ (5), below. $H_u^s$ can, in turn be represented by (6), below, where $H_1$ (7) represents the left-most jp×jp triangularized sub-matrix of the parity bits of the LDPC code.

$$H_u^S = \begin{bmatrix} I & I & I & \dots & I & I & \dots & I \\ 0 & I & \alpha & \dots & \alpha^{j-2} & \alpha^{j-1} & \dots & \alpha^{k-2} \\ 0 & 0 & I & \dots & \alpha^{2(j-3)} & \alpha^{2(j-2)} & \ddots & \alpha^{2(k-3)} \\ \vdots & \vdots & \vdots & \ddots & \vdots & \vdots & \vdots & \vdots \\ 0 & 0 & \dots & \dots & I & \alpha^{j-1} & \dots & \alpha^{(j-1)(k-1)} \end{bmatrix} \quad (5)$$

$$H^S = [H_1 | H_2] \quad (6)$$

$$H_1 = \begin{bmatrix} I & I & I & \dots & I \\ O & I & \alpha & \dots & \alpha^{j-2} \\ O & O & I & \dots & \alpha^{2(j-3)} \\ \vdots & \vdots & \vdots & \ddots & \vdots \\ O & O & O & \dots & I \end{bmatrix}_{jp \times jp} \quad (7)$$

Figure 6:
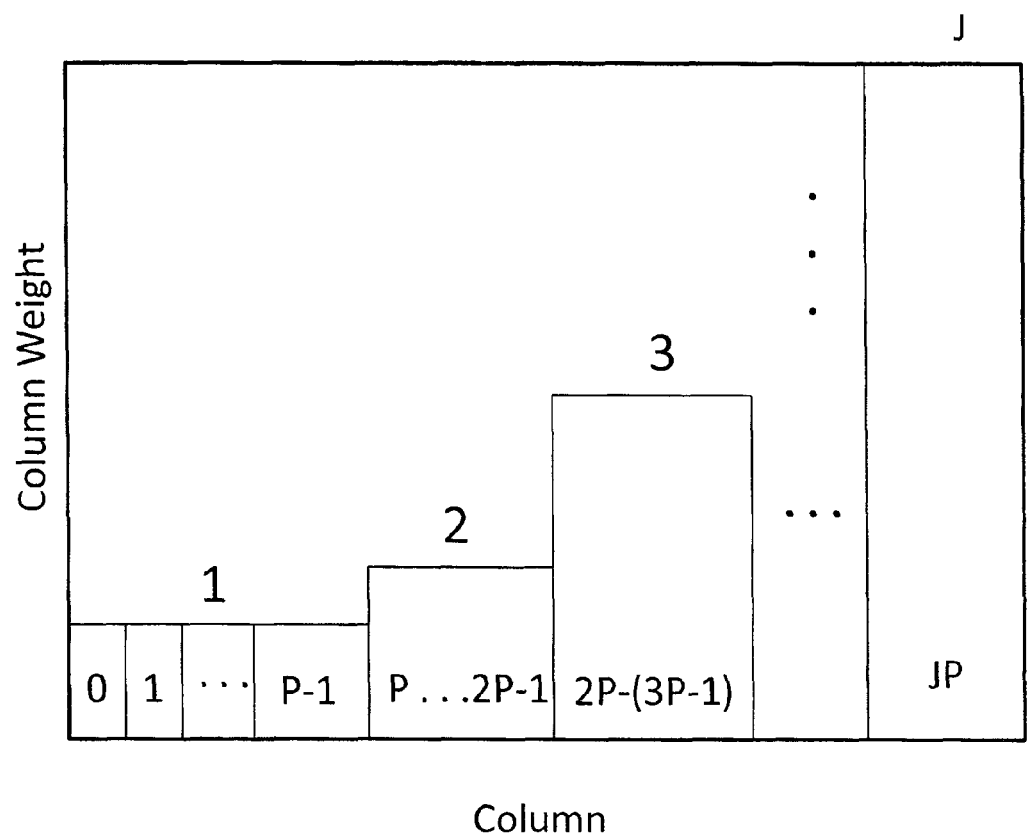
FIG. 6 illustrates an example of the column weights for the parity bits.

The column weight for the parity bits 0 through p−1 in the above $H_1$ matrix are illustrated in FIG. 6. As can be discerned, parity bits 0 through p−1 each have a column weight of 1.

Because these first parity bits of the parity check matrix have only a column weight of 1, a decoder for codewords according to this parity check matrix would be expected to converge more slowly to a confidence value for these bits and to a lower confidence value for these bits than for other parity bits in the codeword. It is also thought that having this weaker error protection for these parity bits may result in fewer errors being detected or corrected for other parity bits of the codewords.

Inventive aspects herein include formulating a parity check matrix that has a column weight of two for one or more of columns 1 through p−1 (i.e., all of the first p parity bits, excluding the parity bit of the 0 column).

In particular, for the array-code like LDPC codes introduced above, these aspects include substituting a matrix β, as defined in (9), below, for the first p×p bits of the $H_u^s$ matrix (5), above. In other words, the first p−1 rows (counting from 0) of the first columns (p−1 columns, also counting from 0) of $H_u^s$ are replaced with β.

$$\beta = \begin{bmatrix} 1 & 1 & 0 & 0 & \cdots & 0 \\ 0 & 1 & 1 & \vdots & \cdots & 0 \\ 0 & 0 & 1 & 1 & 0 & \vdots \\ \vdots & \ddots & \ddots & 1 & 1 & 0 \\ 0 & \vdots & \vdots & \ddots & 1 & 1 \\ 0 & \cdots & 0 & 0 & 0 & 1 \end{bmatrix}_{p \times p} \quad (9)$$

This substitution results in a modified upper triangular matrix that maintains the array-code like qualities of the $H_u^s$ above, while allowing greater protection for the 1 through p−1 parity bits (β has column weight of two in its first through last column, which correspond to the 1 through p−1 column of H—i.e., the second through the $(p-1)^{th}$ column).

An $H_u^s$ modified by substitution of β as described yields H (11), below. H of (11) can also be represented as H=[H$_1$|H$_2$] where H$_1$ is a sparse up-triangle matrix of dimension jp×kp for parity bits. H$_2$ is sparse jp×(k−j)p-sized matrix, for information bits. H of (11) when used to generate LDPC codewords, as further described below, will generate codewords that have a better error protection for the 1 through p−1 parity bits of the codeword.

$$H = \begin{bmatrix} \beta & I & I & \cdots & I & \Big| & I & \cdots & I \\ O & I & \alpha & \cdots & \alpha^{j-2} & \Big| & \alpha^{j-1} & \cdots & \alpha^{k-1} \\ O & O & I & \cdots & \alpha^{2(j-2)} & \Big| & \alpha^{2(j-2)} & \cdots & \alpha^{2(k-3)} \\ \vdots & \vdots & \vdots & \ddots & \vdots & \Big| & \vdots & \ddots & \vdots \\ O & O & O & O & I & \Big| & \cdots & \cdots & \alpha^{(j-1)(k-j)} \end{bmatrix}_{jp \times kp} \quad (11)$$

Encoding

FIG. 1 illustrates a transmitter 100 for user data 101. For convenience, a device having an LDPC encoder is called a transmitter, and such a transmitted is intended to encompass any device for producing LDPC codewords for storage on a media or for transmission through any type of communication channel. The receiver 200, described below with respect to FIG. 2 is intended to encompass any device for performing the inverse operation for LDPC codewords retrieved from a storage medium or received over any channel.

Transmitter 100 comprises a string assembler 105 that receives user data 101 and parses user data 101 into strings of a length for encoding with an LDPC encoder 110. LDPC encoder 110 receives a parity check matrix (e.g., a matrix according to H (11), above). The parity check matrix is formed by matrix generator 115, which produces H (11), above.

Figure 2:
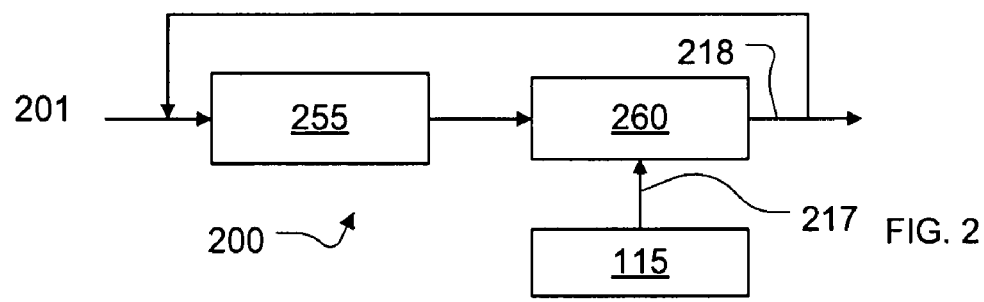
FIG. 2 illustrates an LDPC decoder configured to operate according to aspects described herein.
Figure 3:
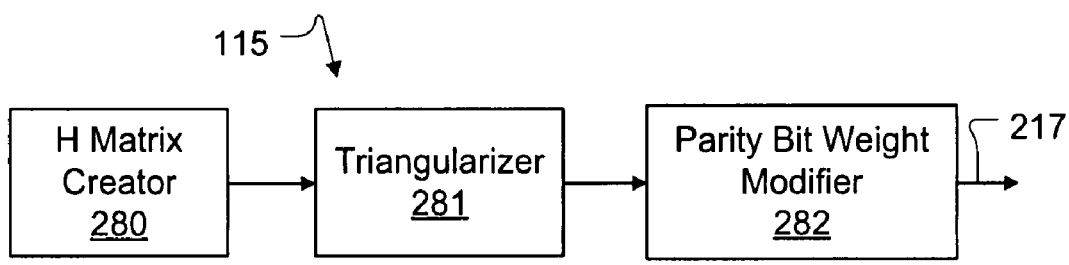
FIG. 3 illustrates an LDPC parity check matrix generator for use in the encoder and decoder of FIG. 1 and FIG. 2.

Matrix generator 115 is illustrated in further detail in FIG. 2. Matrix generator 115 includes an H matrix generator that may receive, produce, or otherwise reference parameters j, k, and p, and generate an H matrix (1). The left most jp×jp portion of this H matrix (1) is then cyclically shifted or otherwise caused to be upper triangular (becomes $H_u^s$ (5) above) by a triangularizer 281.

Thereafter, a parity bit weight modifier 282 substitutes β for columns 0 through p−1 and rows 0 through p−1 of $H_u^s$. Of course, parity bit weight modifier 282 may substitute the values of β that are different from the values of I into $H_u^s$ individually, rather than as a block substitution of β for I.

However, representing these values in the form of the matrix β is convenient. Ultimately, matrix generator 115 produces an H matrix that can be used in production of LDPC codewords that each have stronger protection for the 1 through p−1 parity bits.

Decoding

A receiver according to inventive aspects is represented by receiver 200 of FIG. 2. Generally, receiver 200 operates using the same H matrix that was used to encode the data. Therefore, in one aspect, receiver 200 can either receive the H matrix from transmitter 100, or otherwise reference a copy of the matrix. Alternatively, receiver 200 also can have a parity check matrix generator, such as parity check matrix generator 115. In such an aspect, transmitter 100 may send parameters used in creating the H matrix to receiver 200, wherein matrix generator 115 at receiver 200 uses the parameters to form the H matrix.

Matrix generator 115 then provides the H matrix to LDPC decoder 260, as further described below. In transmission situations, receiver 200 could also first produce an H matrix that is provided to transmitter 100, or receiver 200 could also select parameters for transmission to transmitter 100. Other aspects can include both transmitter 100 and receiver 200 referencing a common set of parameters for selection and production of an H matrix.

Channel 201 represents any means for storage or transfer of data across space and/or time, such as various storage media and various networks. Receiver 200 includes a channel detector 255 appropriate for receiving information from the channel 201 and providing it to an LDPC decoder 260 in a form that can be processed. In particular, LDPC decoders use soft information for decoding an LDPC codeword, and channel detector 255 may be a SOVA or a BCJR channel detector, for example.

Output 218 of LDPC decoder 260 includes estimates for the information encoded (i.e., the (j−k)p information bits) and the parity bits. Output 218 also includes soft information about reliability of these estimates. For example, output 218 may include log likelihood ratios (LLRs) for each bit outputted.

This soft information can be used to determine whether one or more of the information bits and the parity bits are reliable enough for a given application. Where it is determined that either or both of the information and parity bits are not reliable enough, then this soft information can be used in iterative processing within the LDPC decoder 260. For an example ISI channel, receiver 200 can iterate 15 or more times on the channel data using LLR information outputted (i.e., at least a portion of information outputted by output 218) from LDPC decoder 260 and inputted back into channel detector 255, thereby converging on more reliable values for the information and parity bits. In such an implementation, channel detector 255 uses soft information output from LDPC decoder 260 to further process channel data and output soft information for use by LDPC decoder 260 in determining the information bits and the parity bits.

In an iterative message-passing algorithm, an amount of error protection provided to each bit of an LDPC codeword transmitted on the channel depends on a weight of a column in the parity check matrix, which corresponds to the bit of the codeword. A column with a lower weight imparts less error protection on corresponding bits of the LDPC codeword. Thus, according to aspects herein, methods and apparatuses for strengthening the protection for parity bits 1 through p−1 are presented.

Figure 4:
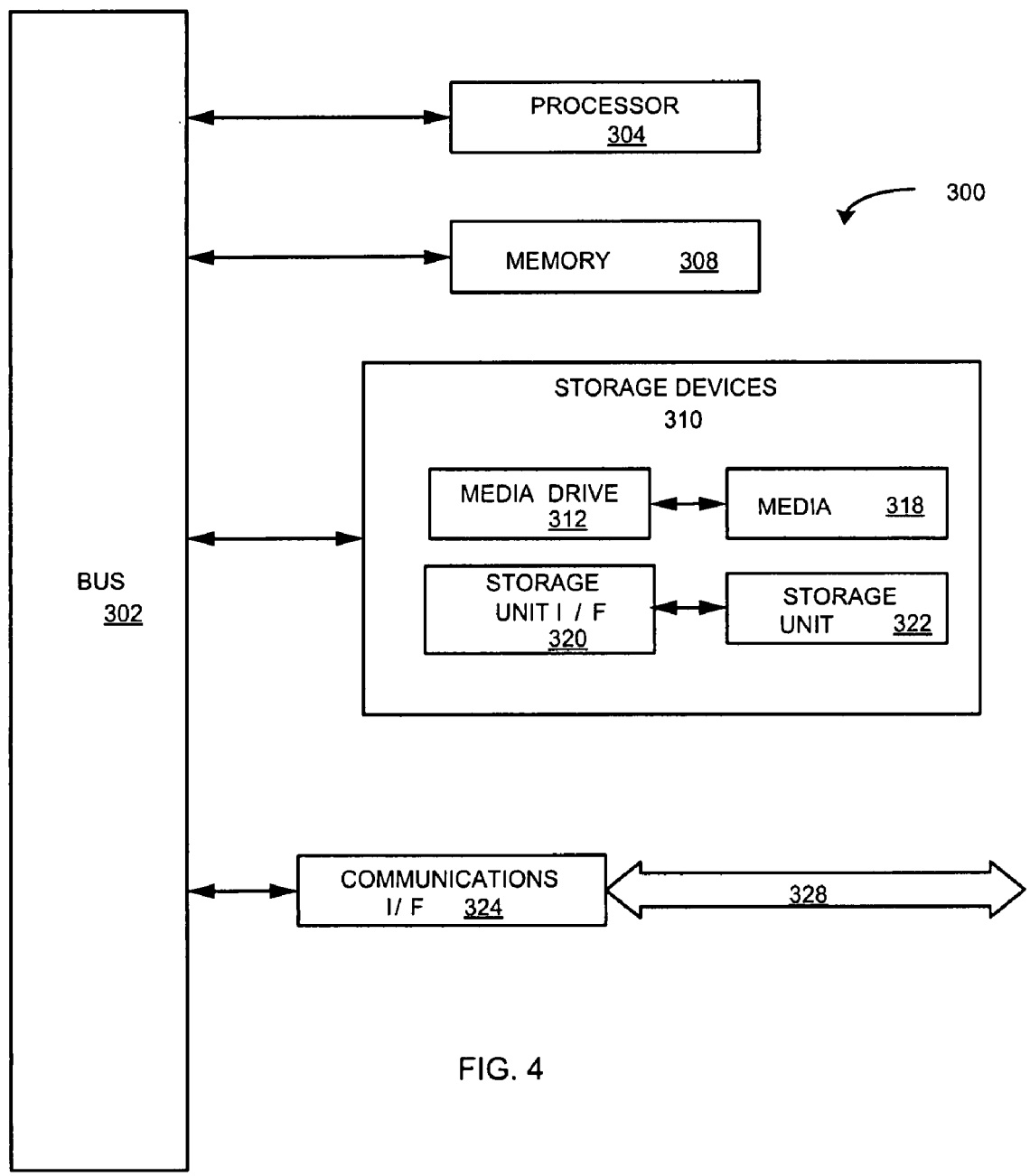
FIG. 4 illustrates a computing system, which may be configured to implement one or more of the encoder, decoder, and parity check matrix generator of FIGS. 1-3.
Figure 5:
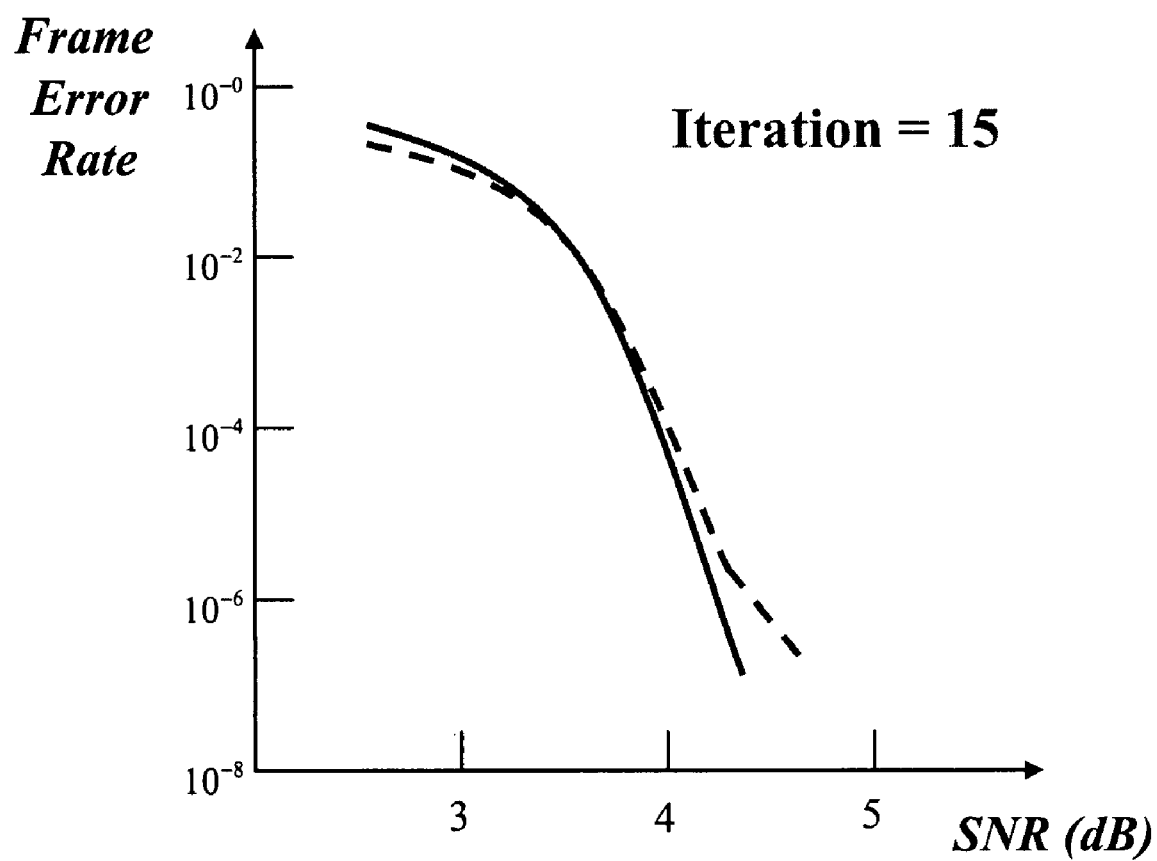
FIG. 5 illustrates an example frame error rate vs. SNR curve for a 15 iteration LDPC decoder cycle according to disclosed aspects.

FIG. 4 illustrates a typical computing system 300 that may be employed to implement processing functionality in embodiments of the invention. Computing systems of this type may be used in clients and servers, for example. Those skilled in the relevant art will also recognize how to implement the invention using other computer systems or architectures. Computing system 300 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 300 can include one or more processors, such as a processor 304. Processor 304 can be implemented using one or more general or special purpose processing engines such as, for example, microprocessor cores, special purpose functional units (e.g., special purpose functional units designed to accelerate one or more tasks), microcontrollers, and other circuitry. In this example, processor 304 is connected to a bus 302 or other communication medium.

Computing system 300 can also include a main memory 308, such as random access memory (RAM) or other dynamic memory, for storing information and instructions to be executed by processor 304. Main memory 308 also may be used for storing temporary variables or other intermediate information during execution of instructions to be executed by processor 304. Computing system 300 may likewise include a read only memory ("ROM") or other static storage device coupled to bus 302 for storing static information and instructions for processor 304.

The computing system 300 may also include information storage system 310, which may include, for example, a media drive 312 and a removable storage interface 320. The media drive 312 may include a drive or other mechanism to support fixed or removable storage media, such as a hard disk drive, a floppy disk drive, a magnetic tape drive, an optical disk drive, a CD or DVD drive (R or RW), or other removable or fixed media drive. Storage media 318, may include, for example, a hard disk, floppy disk, magnetic tape, optical disk, CD or DVD, or other fixed or removable medium that is read by and written to by media drive 314. As these examples illustrate, the storage media 318 may include a computer-readable storage medium having stored therein particular computer software or data.

In alternative situations, information storage system 310 may include other similar components for allowing computer programs or other instructions or data to be loaded into computing system 300. Such components may include, for example, a removable storage unit 322 and an interface 320, such as a program cartridge and cartridge interface, a removable memory (for example, a flash memory or other removable memory module) and memory slot, and other removable storage units 322 and interfaces 320 that allow software and data to be transferred from the removable storage unit 318 to computing system 300.

Computing system 300 can also include a communications interface 324. Communications interface 324 can be used to allow software and data to be transferred between computing system 300 and external devices. Examples of communications interface 324 can include a modem, a network interface (such as an Ethernet or other NIC card), a communications port (such as for example, a USB port), a PCMCIA slot and card, etc. Software and data transferred via communications interface 324 are in the form of signals which can be electronic, electromagnetic, optical or other signals capable of being received by communications interface 324. These signals are provided to communications interface 324 via a channel 328. This channel 328 may carry signals and may be implemented using a wireless medium, wire or cable, fiber optics, or other communications medium. Some examples of a channel include a phone line, a cellular phone link, an RF link, a network interface, a local or wide area network, and other communications channels.

In this document, the terms "computer program product," "computer-readable medium" and the like may be used generally to refer to media such as, for example, memory 308, storage device 318, or storage unit 322. These and other forms of computer-readable media may be involved in storing one or more instructions for use by processor 304, to cause the processor to perform specified operations. Such instructions, generally referred to as "computer program code" (which may be grouped in the form of computer programs or other groupings), when executed, enable the computing system 300 to perform features or functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 300 using, for example, removable storage drive 314, drive 312 or communications interface 324. The control logic (in this example, software instructions or computer program code), when executed by the processor 304, causes the processor 304 to perform the functions of the invention as described herein.

It will be appreciated that, for clarity purposes, the above description has described embodiments of the invention with reference to different functional units and processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Although the present invention has been described in connection with some embodiments, it is not intended to be limited to the specific form set forth herein. Rather, the scope of the present invention is limited only by the claims. Additionally, although a feature may appear to be described in connection with particular embodiments, one skilled in the art would recognize that various features of the described embodiments may be combined in accordance with the invention.

Furthermore, although individually listed, a plurality of means, elements or method steps may be implemented by, for example, a single unit or processor. Additionally, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather the feature may be equally applicable to other claim categories, as appropriate.

The foregoing description of the exemplary embodiments of the invention has been presented for the purposes of illustration and description. It is not intended to be exhaustive or to limit the invention to the precise form disclosed. A latitude of modification, various changes, and substitutions are intended in the present invention. In some instances, features of the invention can be employed without a corresponding use of other features as set forth. Many modifications and variations are possible in light of the above teachings, without departing from the scope of the invention. It is intended that the scope of the invention be limited not with this detailed description, but rather by the claims appended hereto.

I claim:

1. An apparatus for Low-Density Parity-Check (LPDC) encoding of data, comprising:
a processing element configured to produce an LDPC codeword of kp bits from
(k−j)p information bits based on a parity check matrix $H=[H_1|H_2]$, having dimension jk×kp, where
p is a prime number that is equal to or greater than both of numbers k and j,
$H_2$ is a sparse matrix of dimension jp×(k−j)p for the (k−j)p information bits,
$H_1$ is an upper triangular sparse matrix of dimension jp×jp for jp parity check bits, and
one or more of the second column through the p−1$^{th}$ column of H have a column weight of two,
and where $H_1$ comprises a matrix β for the first p×p bits of H so that the first (p−1) rows of the first (p−1) columns of H are β matrices, where a β matrix has a column weight of two in the first through last column of the β matrix.

2. The apparatus of claim 1, further comprising:
an input to the processing element for the (k−j)p information bits; and
a parity matrix generator coupled to the processing element and configured to generate the parity check matrix $H=[H_1|H_2]$.

3. The apparatus of claim 1, wherein the processing element is further configured to receive a segment of information bits greater than (k−j)p bits and to divide the segment into a plurality of portions for production of an LDPC codeword for each portion.

4. The apparatus of claim 1, further comprising:
a second processing element configured to receive a segment of information bits and divide the segment of information bits into (k−j)p-sized portions.

5. The apparatus of claim 4, wherein the segment of information bits is streamed to the second processing element, and the second processing element is configured to buffer the streamed information bits for dividing the segment into the (k−j)p-sized portions.

6. The apparatus of claim 1, wherein the second column through the p−1$^{th}$ column of H each has a column weight of two.

7. An LDPC decoder, comprising:
an input port for data representative of an LDPC codeword of kp bits; and
a processor operable to produce (k−j)p information bits and jp parity check bits based on a parity check matrix $H=[H_1|H_2]$ of dimension jk×kp, wherein
p is a prime number that is equal to or greater than both k and j and
$H_1$ is an upper triangular matrix of dimension jp×jp corresponding to parity check bits, and one or more of columns 1 through column p of $H_1$ have a column weight of two,
and where $H_1$ comprises a matrix β for the first p×p bits of H so that the first (p−1) rows of the first (p−1) columns of H are β matrices, where a β matrix has a column weight of two in the first through last column of the β matrix.

8. The LDPC decoder of claim 7, wherein the produced (k−j)p information bits and jp parity check bits are input to the processor for iterative processing for a predetermined number of iterations.

9. The LDPC decoder of claim 7, wherein the processor is configured to receive as input the produced (k−j)p information bits and jp parity check bits, such that the processor is configured to iteratively process the information bits and parity check bits for a predetermined number of iterations, or until a signal to noise ratio metric has been satisfied.

10. The LDPC decoder of claim 7, wherein columns 1 through p have column weights of two.

11. A method for LDPC encoding information, comprising:
producing a parity check matrix $H=[H_1|H_2]$ of dimension jk×kp from an array-like code, wherein
p is a prime number that is equal to or greater than both j and k,
$H_1$ is an upper triangular matrix of dimension jp×jp corresponding to the parity check bits, and column weights of one or more of columns 1 through p are two, where $H_1$ comprises a matrix β for the first p×p bits of H so that the first (p−1) rows of the first (p−1) columns of H are β matrices, where a β matrix has a column weight of two in the first through last column of the β matrix; and
producing LDPC codewords of kp bits based on the parity check matrix $H=[H_1|H_2]$.

12. The method of claim 11, wherein the column weights of columns 1 through p are two.

13. The method of claim 11, further comprising:
selecting p, j and k;
using the selected p, j and k to define a first matrix of dimension jk×kp of the form of $$H = \begin{bmatrix} 1 & 1 & 1 & \ldots & 1 \\ 1 & \alpha & \alpha^2 & \ldots & \alpha^{k-1} \\ 1 & \alpha^2 & \alpha^4 & \ldots & \alpha^{2(k-1)} \\ \vdots & \vdots & \vdots & & \vdots \\ 1 & \alpha^{j-1} & \alpha^{2(j-1)} & & \alpha^{(j-1)(k-1)} \end{bmatrix}_{jp \times kp};$$

triangularizing, into an upper-triangular form, the first jp×jp rows and columns of the first matrix; and
substituting the β matrix of the form:

$$\beta = \begin{bmatrix} 1 & 1 & 0 & 0 & \ldots & 0 \\ 0 & 1 & 1 & \vdots & \ldots & 0 \\ 0 & 0 & 1 & 1 & \ldots & \vdots \\ \vdots & \vdots & \vdots & 1 & & 0 \\ 0 & \vdots & & & & 1 \\ 0 & \ldots & 0 & 0 & 0 & 1 \end{bmatrix}_{p \times p}$$

for the first p columns and rows of the upper-triangularized first matrix.

14. The method of claim 13, further comprising:
eliminating 4-cycles in the triangularized first matrix.

15. A computer readable medium having stored thereon programming for a method comprising:
producing a parity check matrix $H=[H_1|H_2]$ of dimension jk×kp from an array-like code, wherein
p is a prime number that is equal to or greater than both j and k $H_1$ is an upper triangular matrix of dimension jp×jp corresponding to the parity check bits, and column weights of one or more of columns 1 through p are two, and where $H_1$ comprises a matrix β for the first p×p bits of H so that the first (p−1) rows of the first (p−1) columns of H are β matrices, where a β matrix has a column weight of two in the first through last column of the β matrix.

16. The computer readable medium of claim 15, wherein the column weights of columns 1 through p are two.

17. The computer readable medium of claim 15, wherein the method further comprises:

selecting p, j and k;

using the selected p, j and k to define a first matrix of dimension jk×kp of the form of $$H = \begin{bmatrix} 1 & 1 & 1 & \ldots & 1 \\ 1 & \alpha & \alpha^2 & \ldots & \alpha^{k-1} \\ 1 & \alpha^2 & \alpha^4 & \ldots & \alpha^{2(k-1)} \\ \vdots & \vdots & \vdots & & \vdots \\ 1 & \alpha^{j-1} & \alpha^{2(j-1)} & & \alpha^{(j-1)(k-1)} \end{bmatrix}_{jp \times kp} ;$$

triangularizing, into an upper-triangular form, the first jp×jp rows and columns of the first matrix; and substituting the β matrix of the form:

$$\beta = \begin{bmatrix} 1 & 1 & 0 & 0 & \ldots & 0 \\ 0 & 1 & 1 & \vdots & \ldots & 0 \\ 0 & 0 & 1 & 1 & \ldots & \vdots \\ \vdots & \vdots & \vdots & 1 & & 0 \\ 0 & \vdots & & & & 1 \\ 0 & \ldots & 0 & 0 & 0 & 1 \end{bmatrix}_{p \times p}$$

for the first p columns and rows of the upper-triangularized first matrix.

\* \* \* \* \*

UNITED STATES PATENT AND TRADEMARK OFFICE
CERTIFICATE OF CORRECTION

| | | |
|---|---|---|
| PATENT NO. | : 7,949,932 B2 | Page 1 of 1 |
| APPLICATION NO. | : 11/726310 | |
| DATED | : May 24, 2011 | |
| INVENTOR(S) | : Sizhen Yang | |

It is certified that error appears in the above-identified patent and that said Letters Patent is hereby corrected as shown below:

Specification:

In column 1, lines 29-30, delete "Codes codes" and insert --Codes--.

In column 5, line 42, delete "transmitted" and insert --transmitter--.

Signed and Sealed this
Thirtieth Day of August, 2011

David J. Kappos
*Director of the United States Patent and Trademark Office*